(12) United States Patent
Hwang et al.

(10) Patent No.: US 7,492,588 B2
(45) Date of Patent: Feb. 17, 2009

(54) HEAT DISSIPATION APPARATUS WITH POROUS TYPE HEAT DISSIPATER

(75) Inventors: Ching-Bai Hwang, Taipei Hsien (TW); Jin-Gong Meng, Shenzhen (CN); Jie Zhang, Shenzhen (CN)

(73) Assignees: Furui Precise Component (Kunshan) Co., Ltd., KunShan, Jiangsu Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/746,609

(22) Filed: May 9, 2007

(65) Prior Publication Data

US 2008/0247134 A1    Oct. 9, 2008

(30) Foreign Application Priority Data

Apr. 6, 2007    (CN) .................. 200710073977.6

(51) Int. Cl.
*H05K 7/20*    (2006.01)
*F28F 7/00*    (2006.01)

(52) U.S. Cl. .............. 361/694; 165/80.3; 165/121; 165/185; 361/695; 361/704

(58) Field of Classification Search ........... 361/695, 361/700
See application file for complete search history.

(56) References Cited

U.S. PATENT DOCUMENTS

| 5,701,951 | A | * | 12/1997 | Jean ................ 165/121 |
|---|---|---|---|---|
| 6,411,508 | B1 | * | 6/2002 | Kang et al. ........ 361/695 |
| 6,688,379 | B2 | * | 2/2004 | Huang et al. ....... 165/121 |
| 7,312,985 | B2 | * | 12/2007 | Lee et al. ......... 361/687 |
| 2004/0000392 | A1 | * | 1/2004 | Chen et al. ........ 165/80.3 |
| 2005/0280988 | A1 | * | 12/2005 | Wyatt et al. ....... 361/687 |
| 2007/0044941 | A1 | * | 3/2007 | Kuo .............. 165/80.3 |
| 2007/0121291 | A1 | * | 5/2007 | Wang et al. ....... 361/695 |
| 2007/0204976 | A1 | * | 9/2007 | Uchimura et al. ... 165/122 |
| 2007/0251670 | A1 | * | 11/2007 | Peng et al. ........ 165/80.4 |
| 2007/0267172 | A1 | * | 11/2007 | Hwang et al. ...... 165/80.3 |
| 2008/0011454 | A1 | * | 1/2008 | Hwang et al. ...... 165/80.3 |
| 2008/0117594 | A1 | * | 5/2008 | Hwang et al. ...... 361/697 |

FOREIGN PATENT DOCUMENTS

CN    1797753 A    7/2006

\* cited by examiner

*Primary Examiner*—Gregory D Thompson
(74) *Attorney, Agent, or Firm*—Frank R. Niranjan

(57) ABSTRACT

A heat dissipation apparatus (100) includes a centrifugal blower (20) and a heat dissipater (10). The centrifugal blower includes a casing (22), a stator accommodated in the casing, and a rotor (24) rotatable disposed around the stator. The casing includes a base wall (224), a sidewall (226) surrounding the base wall and a cover (222) attached to the sidewall. The sidewall defines an air outlet (221) therein. An air channel (223) is formed between blades (242) of the rotor and an inner surface of the sidewall of the casing. The heat dissipater is made of porous material and disposed at the air outlet of the centrifugal blower. The heat dissipater has a tongue portion (12) extending into a part of the air channel.

13 Claims, 9 Drawing Sheets ated at an air outlet of the centrifugal blower. The heat dissipater has a tongue portion extending into a part of the air channel.

HEAT DISSIPATION APPARATUS WITH POROUS TYPE HEAT DISSIPATER

BACKGROUND OF THE INVENTION

1. Field of the Invention

The present invention relates generally to a heat dissipation apparatus, and more particularly to a heat dissipation apparatus for dissipating heat generated by electronic components, wherein the heat dissipation apparatus has a heat dissipater including a plurality of through pores for increasing heat dissipation efficiency of the heat dissipater.

2. Description of Related Art

Following the increase in computer processing power that has been seen in recent years, greater emphasis is now being laid on increasing the efficiency and effectiveness of heat dissipation devices. Referring to FIG. 9, a conventional heat dissipation apparatus 40 includes a centrifugal blower 42 and a rectangular shaped heat dissipater 44 disposed at an air outlet 421 of the centrifugal blower 42. The heat dissipater 44 includes a plurality of stacked fins 442 which thermally connect with a heat generating electronic component (not shown) to absorb heat therefrom. The centrifugal blower 42 includes a casing 422, a stator (not shown) mounted in the casing 422, and a rotor 423 rotatably disposed around the stator. When the centrifugal blower 42 is activated, the rotor 423 rotates along a counterclockwise direction around the stator to drive an airflow 46 to flow through the heat dissipater 44 to take away heat from the heat dissipater 44.

In operation of the centrifugal blower 42, the airflow leaves the centrifugal blower 42 at an upper side of the air outlet 421 and flows towards a downside of the air outlet 421. Both flow speed and air pressure of an upstream airflow 461 are greater than those of a downstream airflow 462. Therefore, the heat dissipation capability of the upstream airflow 461 is stronger than that of the downstream airflow 462. However, upstream fins 442 of the heat dissipater 44 have the same heat dissipation capability as downstream fins 442. That is, the heat dissipation capability of the upstream fins 442 does not match the heat dissipation capability of the upstream airflow 461. This causes a waste of energy of the upstream airflow 461. Accordingly, it can be seen that the heat dissipation efficiency of the heat dissipation apparatus 40 has room for improvement.

SUMMARY OF THE INVENTION

The present invention relates to a heat dissipation apparatus for dissipating heat from a heat-generating electronic component. According to a preferred embodiment of the present invention, the heat dissipation apparatus includes a centrifugal blower and a heat dissipater. The centrifugal blower includes a casing, a stator accommodated in the casing, and a rotor rotatably disposed around the stator. The casing includes a base wall, a sidewall surrounding the base wall and a cover attached to the sidewall. The sidewall defines an air outlet therein. An air channel is formed between blades of the rotor and an inner surface of sidewall of the casing. The heat dissipater is made of porous material and disposed at the air outlet of the centrifugal blower. The heat dissipater has a tongue portion extending into a part of the air channel.

Other advantages and novel features of the present invention will become more apparent from the following detailed description of preferred embodiment when taken in conjunction with the accompanying drawings, in which:

DETAILED DESCRIPTION OF THE INVENTION

Figure 1:
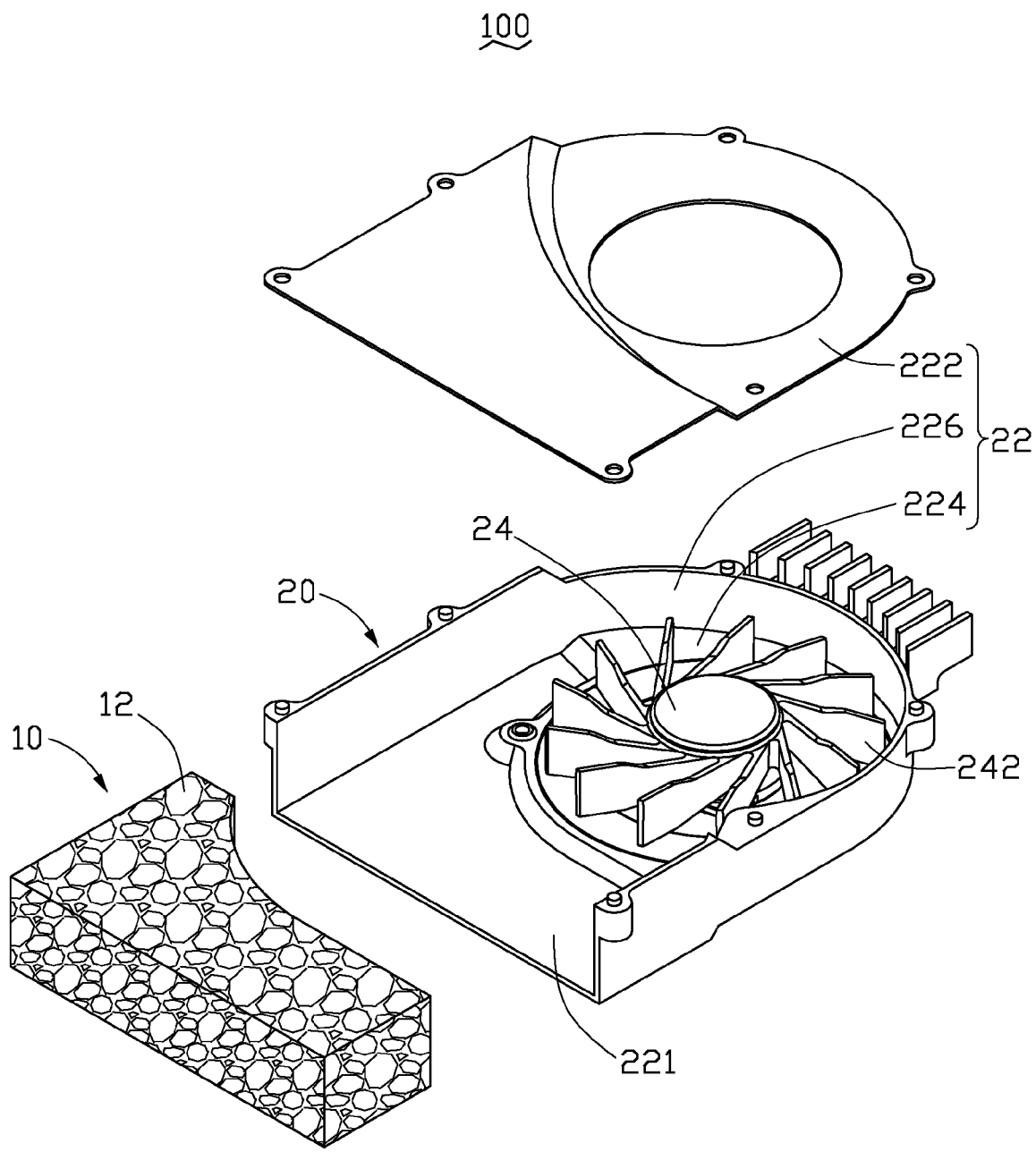
FIG. 1 is an exploded, isometric view of a heat dissipation apparatus according to a preferred embodiment of the present invention.
Figure 2:
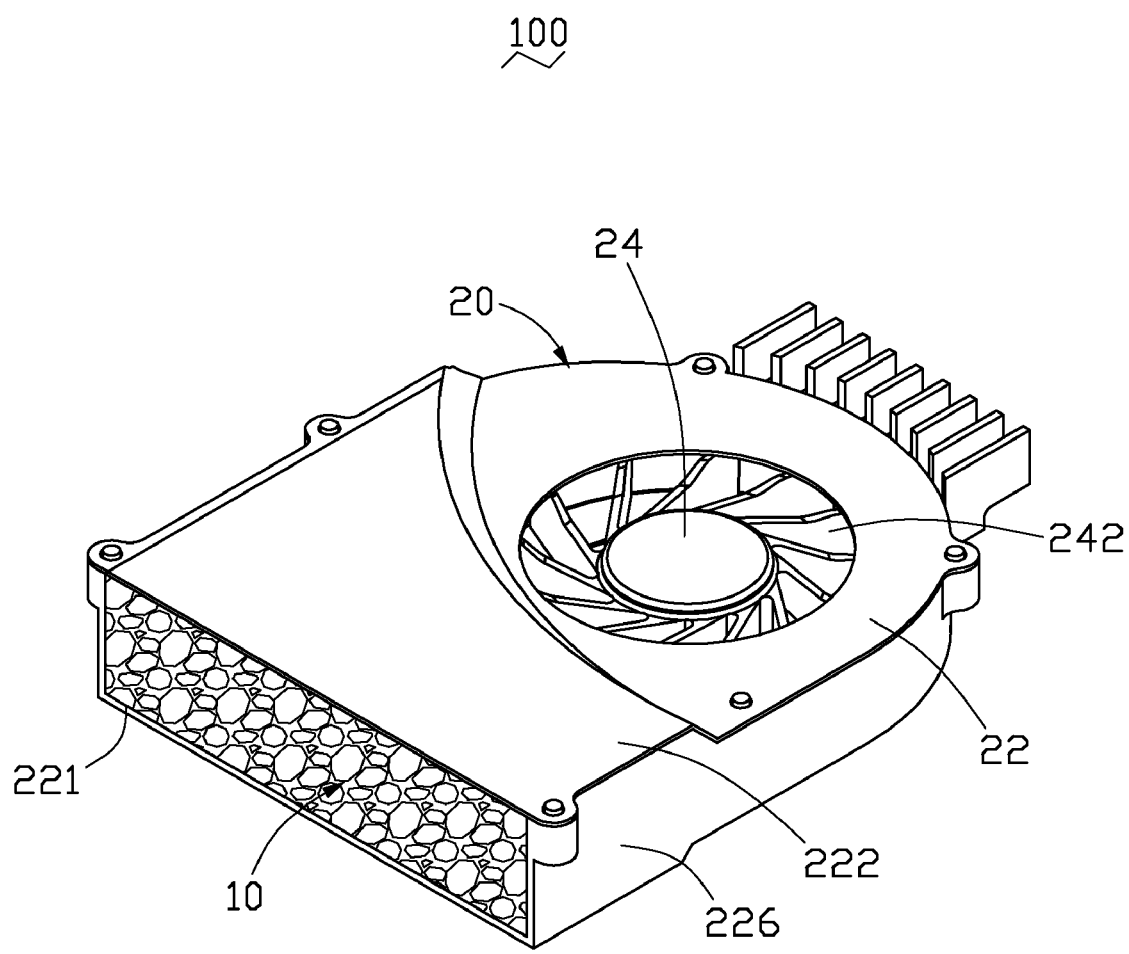
FIG. 2 is an assembled view of the heat dissipation apparatus of FIG. 1.

Referring to FIGS. 1 and 2, a heat dissipation apparatus 100 according to a preferred embodiment of the present invention is shown. The heat dissipation apparatus 100 includes a heat dissipater 10 and a centrifugal blower 20. The heat dissipater 10 thermally connects with a heat generating electronic component (not shown) to absorb heat therefrom. The centrifugal blower 20 provides airflow flowing through the heat dissipater 10 to take away heat from the heat dissipater 10.

Figure 3:
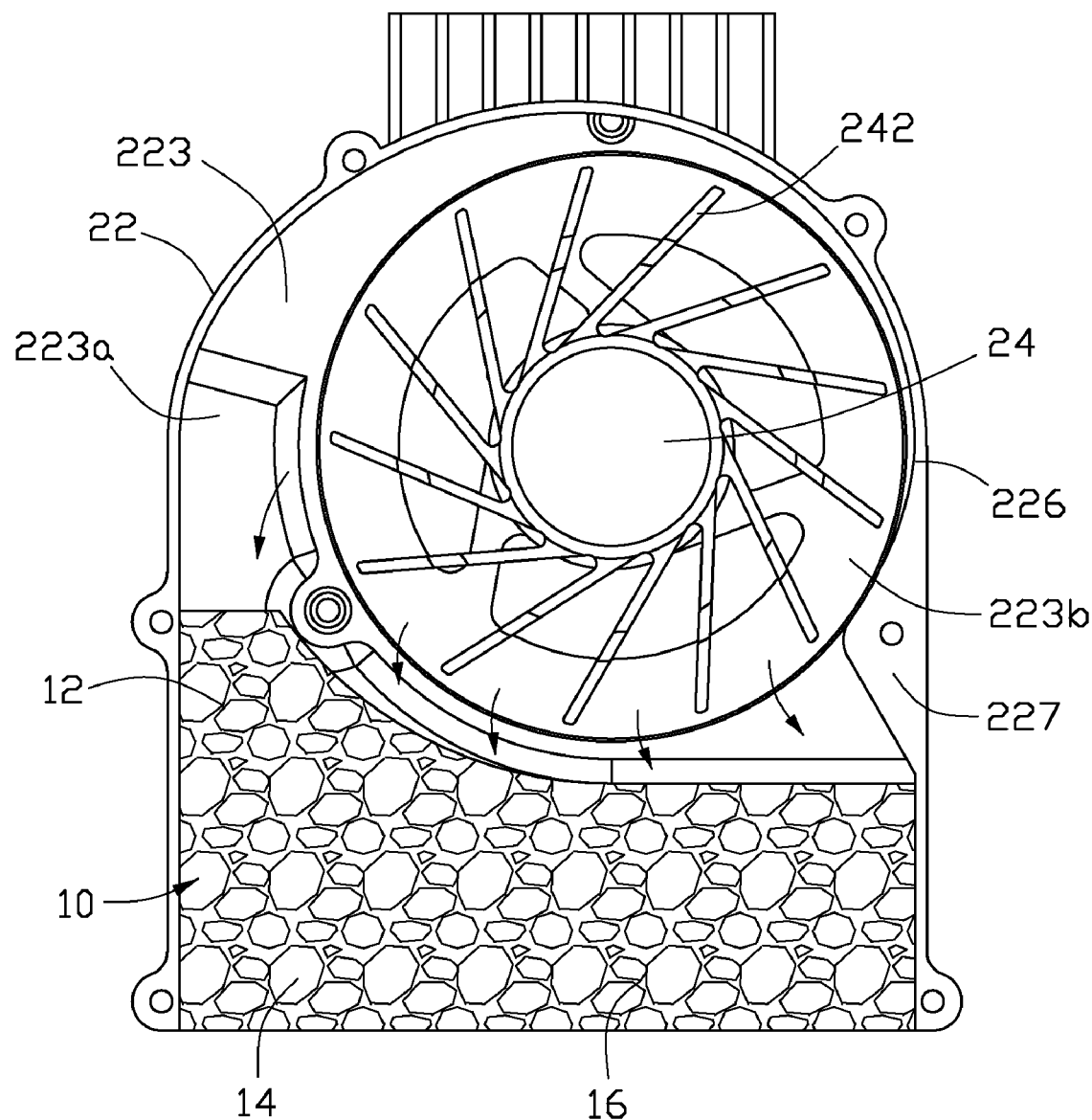
FIG. 3 is a top view of the heat dissipation apparatus of FIG. 2, with a top cover thereof removed.

Referring also to FIG. 3, the centrifugal blower 20 includes a casing 22, a stator (not shown) accommodated in the casing 22, and a rotor 24 rotatably disposed around the stator. The casing 22 includes a base wall 224, a U-shaped sidewall 226 perpendicularly extending upwardly from the base wall 224, and a top cover 222 attached to the sidewall 226. The sidewall 226 defines a rectangular shaped air outlet 221 therein, and has a triangular tongue 227 protruding inwardly towards the rotor 24 at a portion adjacent to the air outlet 221. An air channel 223 is formed between blades 242 of the rotor 24 and an inner surface of the sidewall 226. A width of the air channel 223 gradually increases from the tongue 227 towards an end of the sidewall 226 remote from the tongue 227. The air channel 223 includes a narrow portion 223b adjacent to the tongue 227 and a wide portion 223a remote from the tongue 227. In operation, the airflow rotates in a counterclockwise direction and leaves the centrifugal blower 20 at the wide portion 223a of the air channel 223 and then flows towards the tongue 227. That is, the wide portion 223a of the air channel 223 is positioned in an upstream airflow, and the tongue 227 is positioned downstream of the airflow. An indent (not labeled) is defined in a top surface of the base wall 224 and extends from the wide portion 223a of the air channel 223 towards the air outlet 221. Therefore, a height of the air outlet 221 of the centrifugal blower 20 and the wide portion 223a of the air channel 223 is greater than a height of the narrow portion 223b of the air channel 223 of the centrifugal blower 20. Thus, the airflow can flow from the narrow portion 223b of the air channel 223 towards a larger room, and the heat dissipater 10 can be made to have a larger heat dissipating area.

Figure 9:
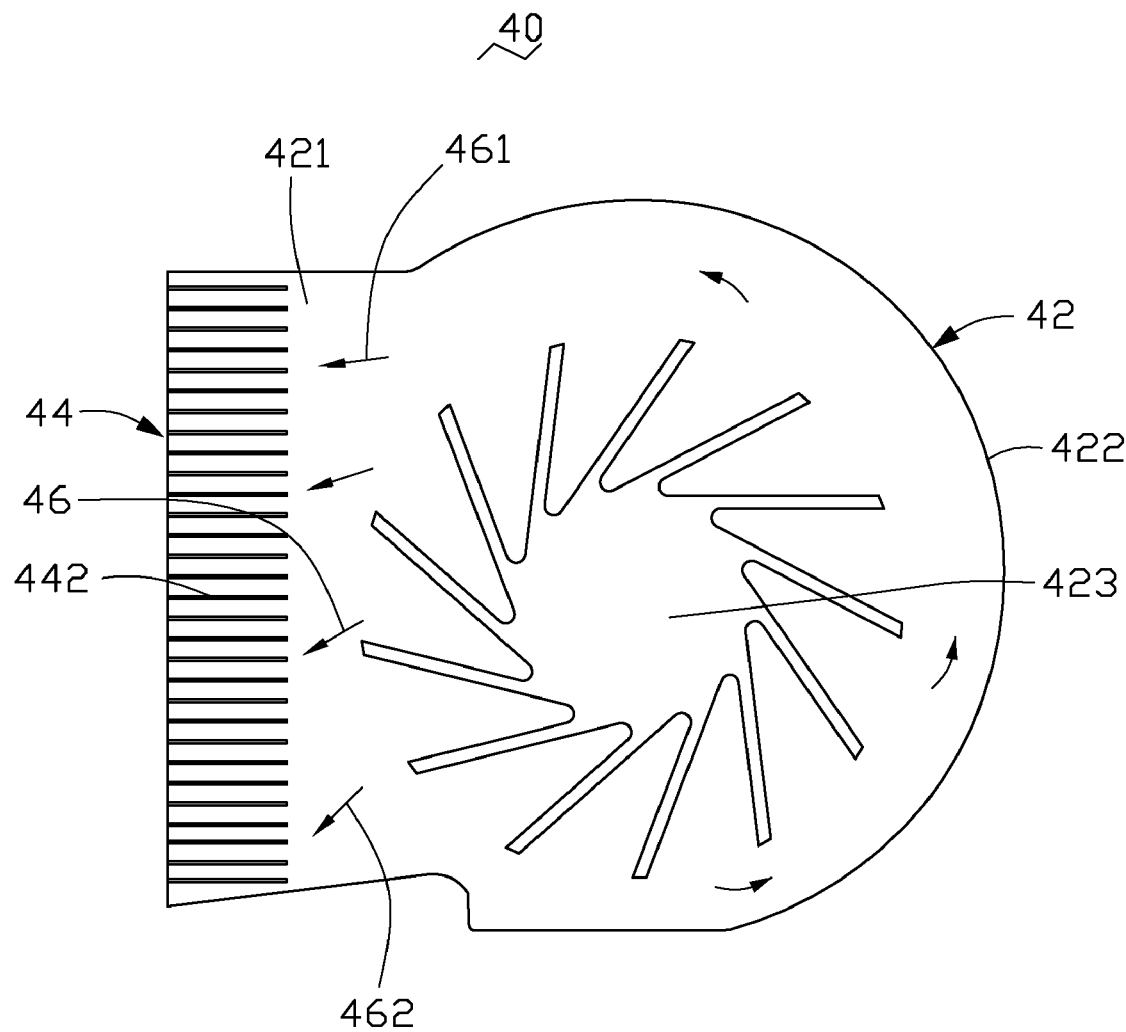
FIG. 9 is a top view of a conventional heat dissipation apparatus with a top cover thereof removed.

The heat dissipater 10 is made of porous material having a plurality of through pores 14 evenly distributed therein and made by electroforming, die-casting, or any other suitable methods. The heat dissipater 10 can easily be made to have regular or irregular configurations. Therefore, the heat dissipater 10 can be made to have suitable configurations which match different centrifugal blowers having different configurations so that the heat dissipation apparatus 100 can have as good a heat dissipation efficiency as possible. In this embodiment, the heat dissipater 10 is made of metal foam (i.e., solid metal defining 'Swiss-cheese' style cavities) and has an irregular configuration. The heat dissipater 10 includes a substantially rectangular shaped main portion 16 and a substantially trapezoidal tongue portion 12. The main portion 16 is arranged at the air outlet 221 of the centrifugal blower 20, and the tongue portion 12 extends into a part of the wide portion 223a of the air channel 223 of the centrifugal blower 20. The tongue portion 12 increases the heat dissipation area of the heat dissipater 10 as compared to the rectangular shaped conventional heat dissipater 44 of FIG. 9. An inner side of the tongue portion 12 of the heat dissipater 10 is disposed nearer to the blades 242 of the centrifugal blower 20 than the upstream fins 442 of the rectangular shaped conventional heat dissipater 44 of FIG. 9. This decreases loss in kinetic energy of the airflow flowing towards the heat dissipater 10 and increases the heat dissipation efficiency of the heat dissipation apparatus 100.

In the present invention, the heat dissipater 10 has a tongue portion 12 which extends into the air channel 223 of the centrifugal blower 20. Therefore, a first section of the heat dissipater 10, which corresponds to an upstream airflow and the wide portion 223a of the air channel 223, has stronger heat dissipation capability than a second section of the heat dissipater 10, which corresponds to a downstream airflow and the tongue 227. Thus, the upstream section (the first section) of the heat dissipater 10 has strong heat dissipation capability which matches the heat dissipation capability of the upstream airflow. Accordingly, the heat dissipation capabilities of the upstream airflow are fully employed, and the heat dissipation efficiency of the heat dissipation apparatus 100 is thus increased. In addition, the heat dissipater 10 is made of porous material. Therefore, the present heat dissipater 10 has larger heat dissipation area than the conventional fin-type heat dissipater 44 when the present heat dissipater 10 has the same size as the conventional heat dissipater 44 of FIG. 9. Therefore, the present heat dissipation apparatus 100 has better heat dissipation efficiency than the conventional heat dissipation apparatus 40. The heat dissipater 10 includes a plurality of communicating pores 14 which increases air turbulence in the heat dissipater 10 and further increases the heat dissipation efficiency of the heat dissipation apparatus 100.

Figure 4:
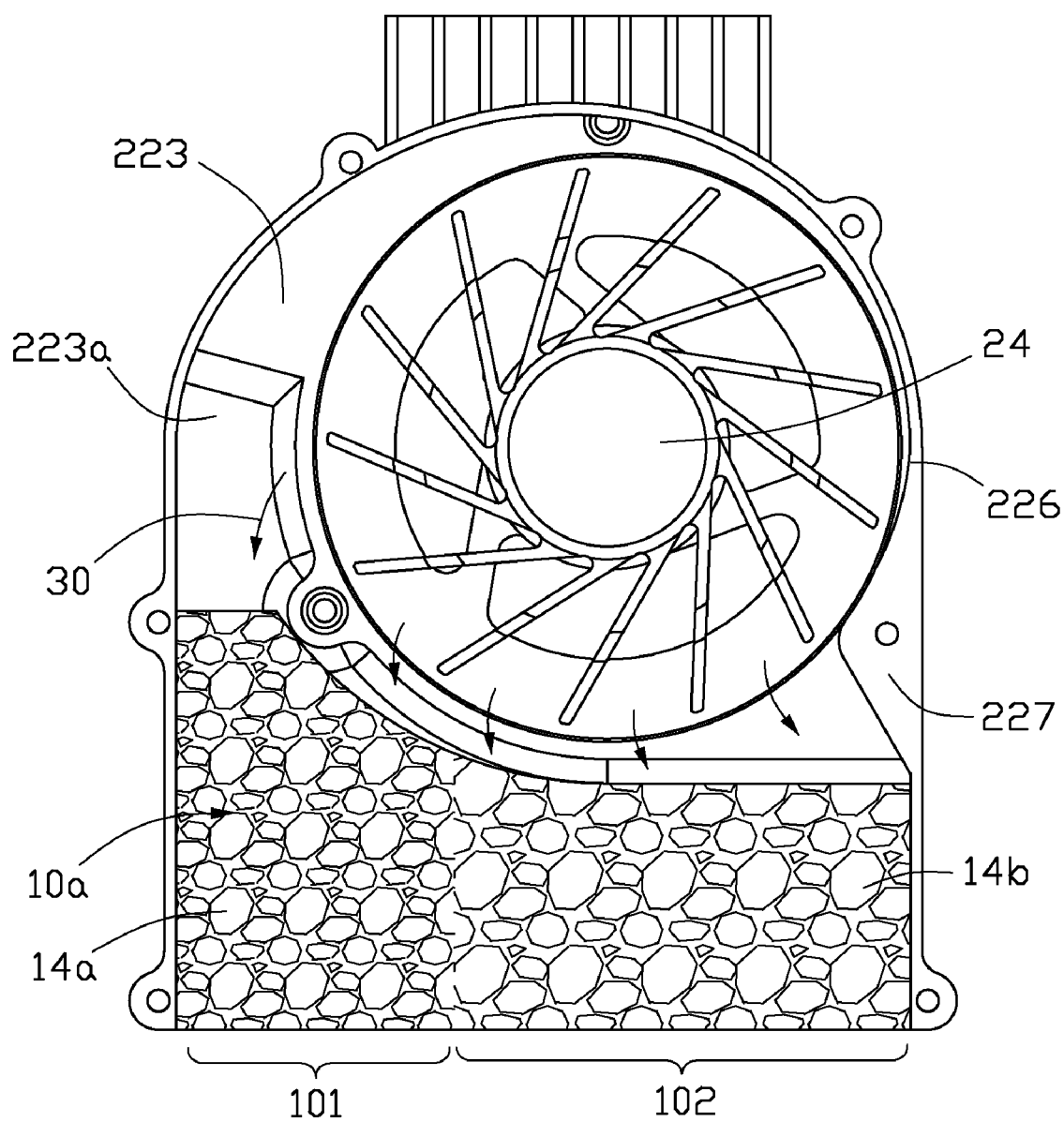
FIG. 4 is similar to FIG. 3, but according to a second embodiment of the present invention.

Referring to FIG. 4, a second embodiment of the present heat dissipation apparatus 100 is shown. In this embodiment, the heat dissipater 10a has the same configuration as the heat dissipater 10 in the first embodiment. However, an average pore size of pores 14b in the downstream section 102 of the heat dissipater 10a is greater than that of pores 14a in the upstream section 101 of the heat dissipater 10a in the second embodiment. Therefore, the upstream section 101 of the heat dissipater 10a has larger heat dissipating area than that of the downstream section 102 of the heat dissipater 10a. Thus, the heat dissipation capabilities of the upstream and downstream sections 101, 102 of the heat dissipater 10a respectively match the heat dissipation capabilities of the airflows flowing therethrough. This increases the heat dissipation efficiency of the heat dissipation apparatus 100. Alternatively, the average pore size of the pores 14 of the heat dissipater 10 may be gradually increased from the upstream section 101 towards the downstream section 102 of the heat dissipater 10.

Figure 5:
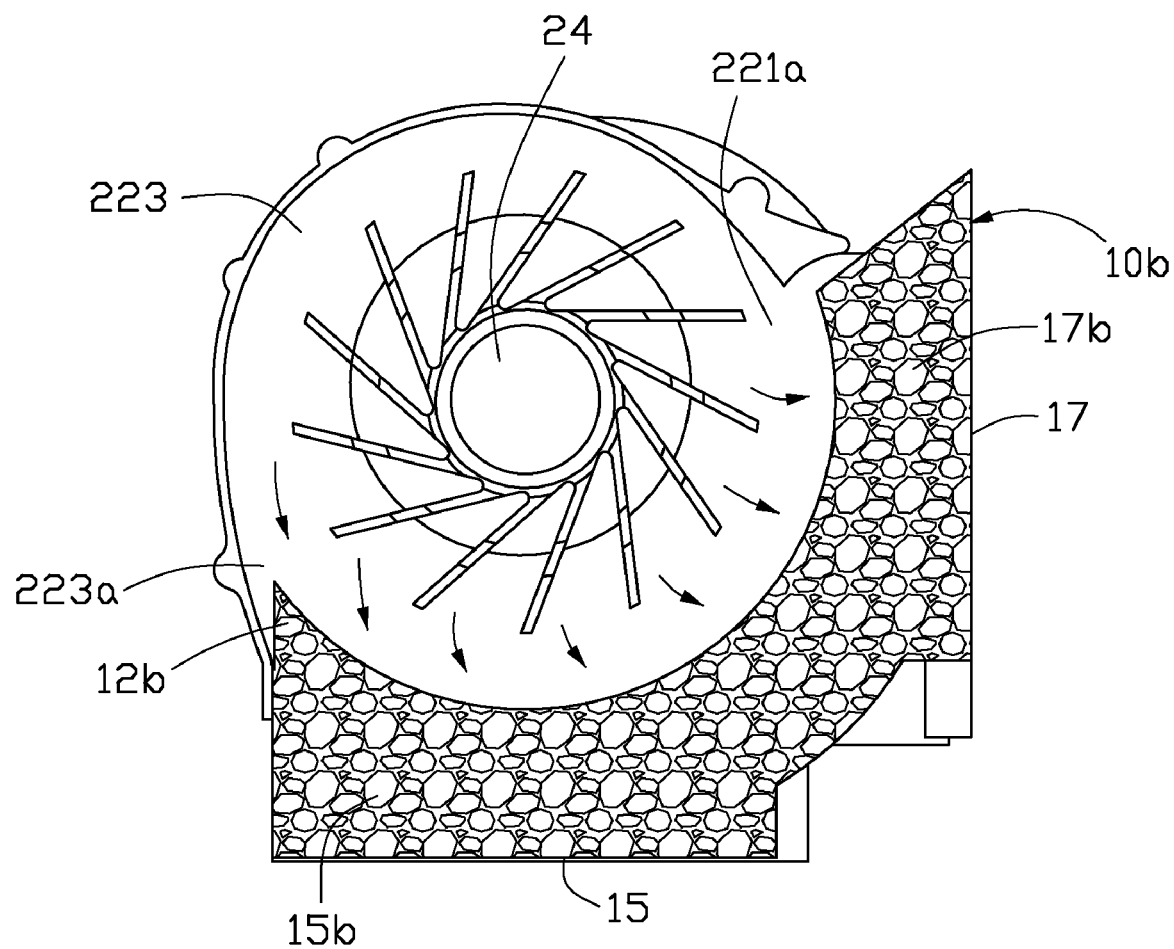
FIG. 5 is similar to FIG. 3, but according to a third embodiment of the present invention.

Referring to FIG. 5, a third embodiment of the present heat dissipation apparatus 100 is shown. In the third embodiment, the air outlet 221a of the centrifugal blower 20 includes two rectangular shaped sub-outlets 15, 17. The sub-outlets 15, 17 are perpendicular to and communicate with each other. The heat dissipater 10b includes two perpendicular main portions 15b, 17b respectively disposed at the sub-outlets 15, 17 and a triangular tongue portion 12b extending into the wide portion 223a of the air channel 223 of the centrifugal blower 20.

Figure 6:
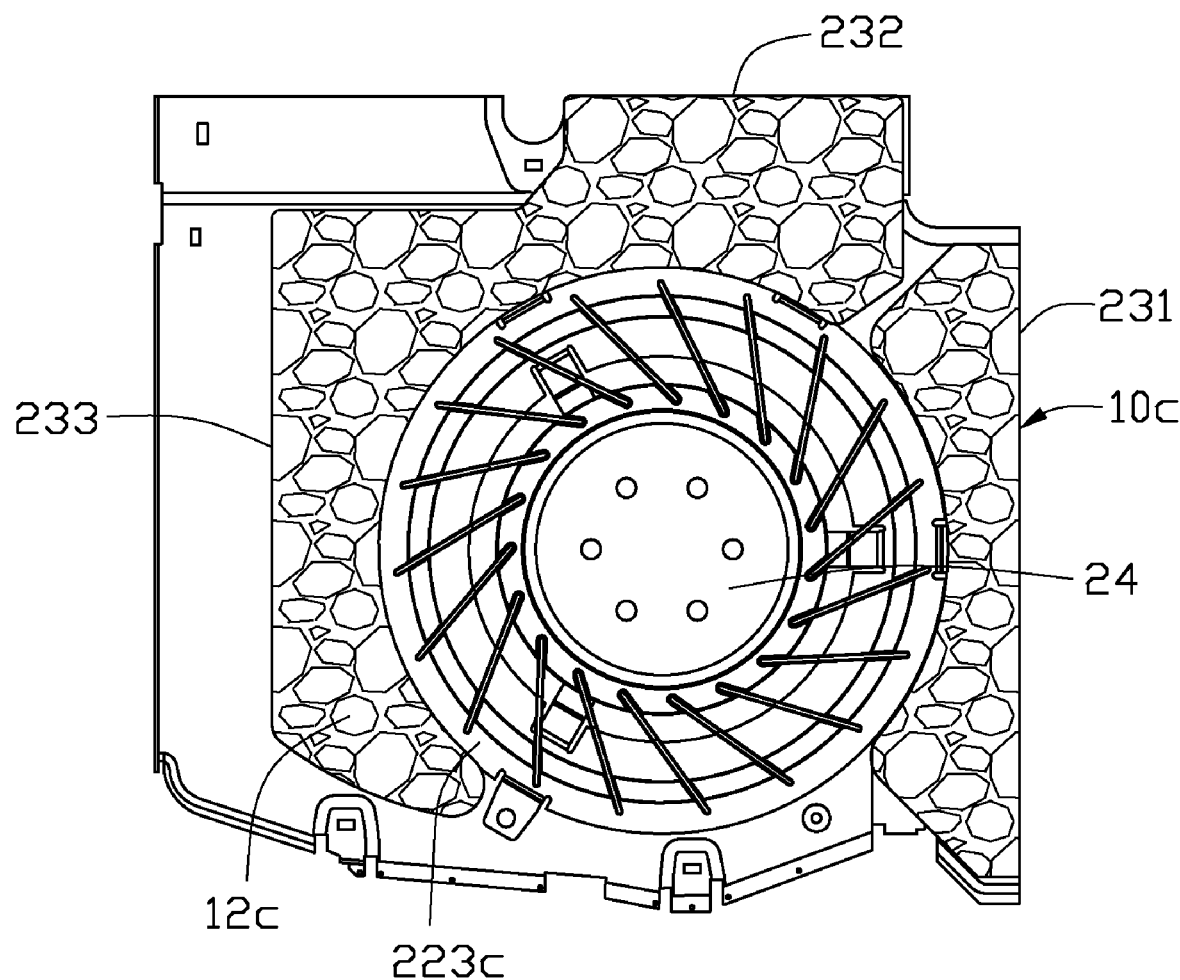
FIG. 6 is similar to FIG. 3, but according to a fourth embodiment of the present invention.

Referring to FIG. 6, a fourth embodiment of the present heat dissipation apparatus 100 is shown. In the fourth embodiment, the air outlet 221 of the centrifugal blower 20 is U-shaped in profile and includes three rectangular shaped sub-outlets, i.e. first, second and third sub-outlets 231, 232, 233. The second sub-outlet 232 is located between the first and the third sub-outlets 231, 233, and communicates the first sub-outlet 231 with the third sub-outlet 233. The first sub-outlet 231 is perpendicular to the second sub-outlet 232, and parallel to the third sub-outlet 233. The heat dissipater 10c has a substantially U-shaped configuration so as to match the air outlet 221 of the centrifugal blower 20. The heat dissipater 10c also includes a tongue portion 12c extending into the wide portion 223c of the air channel 223.

Figure 7:
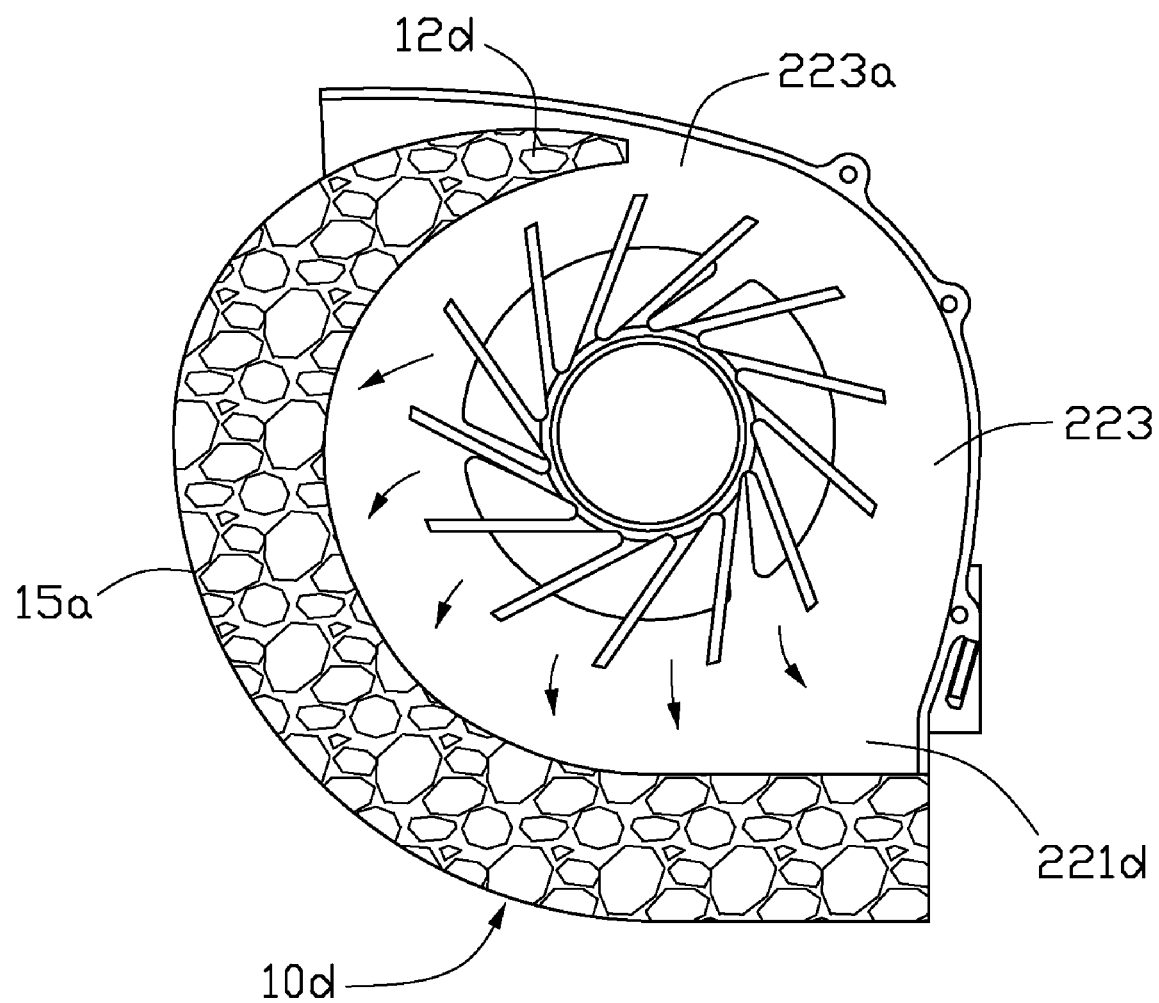
FIG. 7 is similar to FIG. 3, but according to a fifth embodiment of the present invention.

Referring to FIG. 7, a fifth embodiment of the present heat dissipation apparatus 100 is shown. In the fifth embodiment, the centrifugal blower 20 has an arc shaped air outlet 221d, whilst the heat dissipater 10d has an arc-shaped main portion 15a so as to match the air outlet 221d of the centrifugal blower 20. The heat dissipater 10d also includes a substantially arc-shaped tongue portion 12d extending into the wide portion 223a of the air channel 223 of the centrifugal blower 20.

Figure 8:
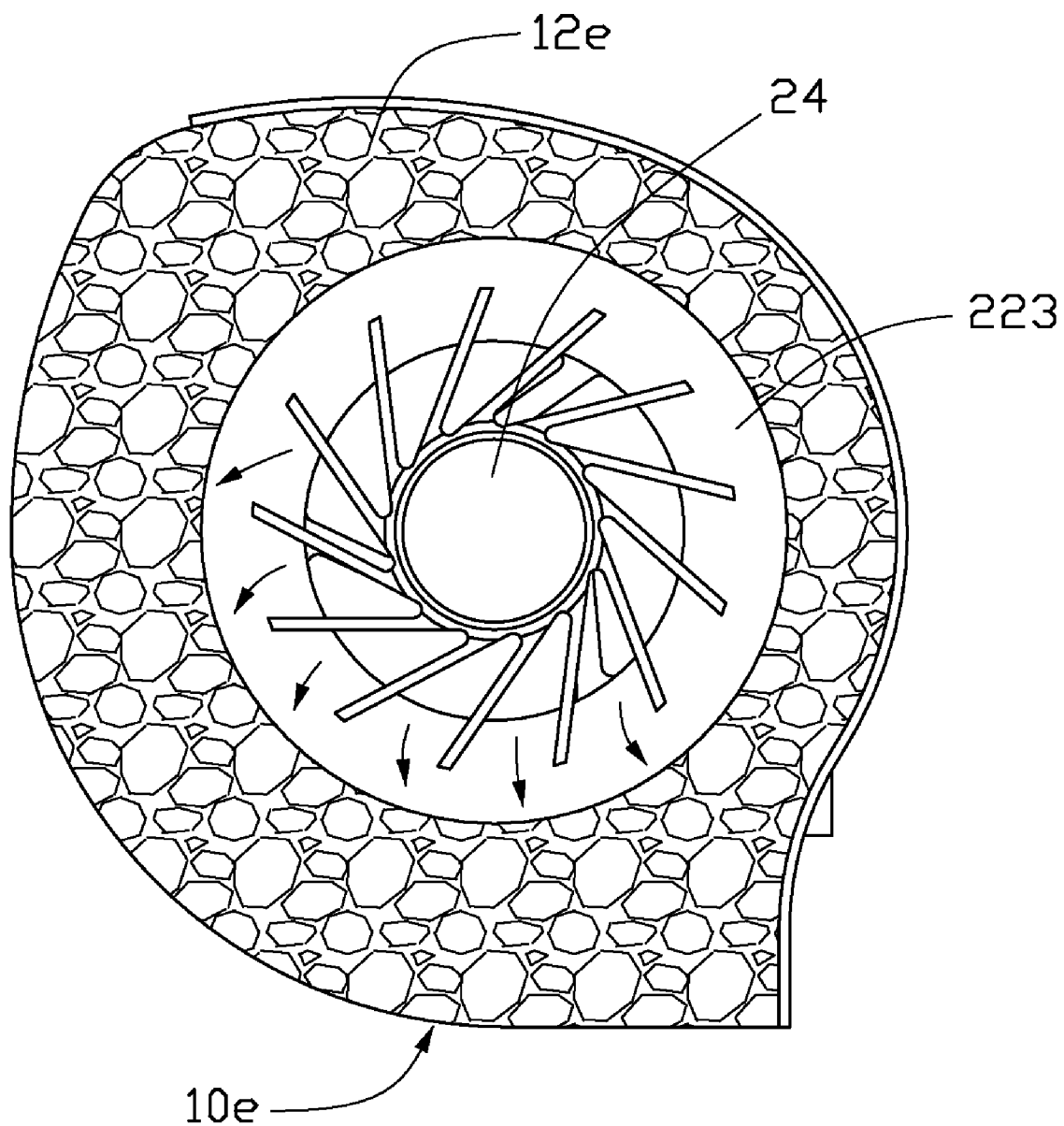
FIG. 8 is similar to FIG. 3, but according to a sixth embodiment of the present invention.

Referring to FIG. 8, a sixth embodiment of the present heat dissipation apparatus 100 is shown. In this embodiment, the heat dissipater 10e is annular shaped in profile and disposed around the entire air channel 223 of the centrifugal blower 20. That is, the heat dissipater 10e has a tongue portion 12e extending into the entire air channel 223 of the centrifugal blower 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation apparatus comprising:
   a centrifugal blower comprising a casing, a stator accommodated in the casing, and a rotor rotatably disposed around the stator, the casing comprising a base wall, a sidewall surrounding the base wall and a cover attached to the sidewall, the sidewall defining an air outlet therein, an air channel formed between blades of the rotor and an inner surface of sidewall of the casing; and
   a heat dissipater, adapted for thermally connecting with a heat-generating electronic device, made of a porous material and disposed at the air outlet of the centrifugal blower, wherein when the rotor rotates, the rotor generates an airflow flowing through the heat dissipater;
   wherein the heat dissipater comprises a main portion disposed at the air outlet of the centrifugal blower and a tongue portion extending into the air channel of the centrifugal blower; and wherein the air channel comprises a wide portion located in an upstream airflow, the sidewall of the casing forming a tongue located in a downstream airflow, a narrow portion of the channel being defined between the tongue and the blades of the rotor, the tongue portion of the heat dissipater being disposed at the wide portion of the air channel of the centrifugal blower.

2. The heat dissipation apparatus as described in claim 1, wherein a width of the air channel is gradually increased from the tongue towards a side remote from the tongue.

3. The heat dissipation apparatus as described in claim 1, wherein the base wall of the centrifugal blower defines an indent extending from the wide portion of the air channel towards the air outlet and through the air outlet entirely.

4. The heat dissipation apparatus as described in claim 1, wherein the heat dissipater comprises an upstream section corresponding to the upstream airflow and a downstream section corresponding to the downstream airflow, an average pore size of pores of the downstream section of the heat dissipater being greater than that of the upstream section of the heat dissipater.

5. The heat dissipation apparatus as described in claim 4, wherein an average pore size of pores of the heat dissipater is gradually increased from the upstream section towards the downstream section of the heat dissipater.

6. A heat dissipation apparatus, comprising:
- a blower having a casing defining an airflow outlet, and an impeller rotatably mounted in the blower, wherein when the impeller rotates, an airflow flows through the airflow outlet; and
- a heat dissipater made of metallic foam being located at the airflow outlet, the heat dissipater being adapted for receiving heat from a heat-generating electronic device;

wherein the heat dissipater has a tongue portion extending from an upstream section of the heat dissipater into a channel between the casing of the blower and blades of the impeller, the airflow generated by the impeller first reaching the upstream section of the heat dissipater and then to a downstream section of the heat dissipater; and wherein the casing forms a tongue located near the downstream section of the heat dissipater.

7. The heat dissipation apparatus as described in claim 6, wherein the tongue portion of the heat dissipater has a trapezoidal shape.

8. The heat dissipation apparatus as described in claim 6, wherein the tongue portion of the heat dissipater has a triangular shape.

9. The heat dissipation apparatus as described in claim 6, wherein the tongue portion of the heat dissipater has an arc shape.

10. The heat dissipation apparatus as described in claim 6, wherein pore size of the metallic foam at the upstream section thereof is smaller than that of the metallic foam at the downstream section thereof.

11. The heat dissipation apparatus as described in claim 7, wherein the heat dissipater has a rectangular shaped main portion.

12. The heat dissipation apparatus as described in claim 8, wherein the heat dissipater comprises two main portions, which are oriented perpendicular to each other.

13. The heat dissipation apparatus as described in claim 9, wherein the heat dissipater has an arc-shaped configuration.

* * * * *